United States Patent
Chen et al.

(10) Patent No.: US 11,930,630 B2
(45) Date of Patent: Mar. 12, 2024

(54) DYNAMIC RANDOM ACCESS MEMORY CAPACITOR AND PREPARATION METHOD THEREFOR

(71) Applicant: CHANGXIN MEMORY TECHNOLOGIES, INC., Hefei (CN)

(72) Inventors: Zhuo Chen, Hefei (CN); Ying-Chih Wang, Hefei (CN); Shih-Shin Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 361 days.

(21) Appl. No.: 17/471,243

(22) Filed: Sep. 10, 2021

(65) Prior Publication Data

US 2022/0165841 A1    May 26, 2022

Related U.S. Application Data

(63) Continuation of application No. PCT/CN2021/105504, filed on Jul. 9, 2021.

(30) Foreign Application Priority Data

Nov. 26, 2020   (CN) .......................... 202011349123.8

(51) Int. Cl.
*H10B 12/00* (2023.01)
*H01L 49/02* (2006.01)

(52) U.S. Cl.
CPC ............. *H10B 12/03* (2023.02); *H01L 28/40* (2013.01); *H10B 12/01* (2023.02)

(58) Field of Classification Search
CPC ......... H01L 28/40; H01L 28/56; H10B 12/03; H10B 12/033
See application file for complete search history.

(56) References Cited

U.S. PATENT DOCUMENTS

| | | |
|---|---|---|
| 7,799,631 B2 | 9/2010 | Park |
| 9,136,317 B1 | 9/2015 | Mao |
| 9,202,861 B1 | 12/2015 | Mao |
| 2008/0160712 A1 | 7/2008 | Park |
| 2011/0110015 A1* | 5/2011 | Zhang .................... H01G 4/206 29/25.42 |

(Continued)

FOREIGN PATENT DOCUMENTS

| | | |
|---|---|---|
| CN | 103755339 A | 4/2014 |
| CN | 105321886 A | 2/2016 |

(Continued)

OTHER PUBLICATIONS

"The study of structure and properties of Ta or La doped Hf02 thin films", May 2014, Miao Chunyu, Dalian University of Technology, 52 pgs.

(Continued)

*Primary Examiner* — Robert G Bachner
*Assistant Examiner* — Molly K Reida
(74) *Attorney, Agent, or Firm* — Cooper Legal Group, LLC

(57) ABSTRACT

A Dynamic Random Access Memory (DRAM) capacitor and a preparation method therefor are provided. The DRAM capacitor includes a dielectric layer, and the dielectric layer includes a high dielectric material layer, and low dielectric loss material layers provided on both side surfaces of the high dielectric material layer.

19 Claims, 4 Drawing Sheets

(56) References Cited

U.S. PATENT DOCUMENTS

2015/0349049 A1    12/2015    Mao

FOREIGN PATENT DOCUMENTS

| CN | 106915958 A | 7/2017 |
| CN | 108748942 A | 11/2018 |
| CN | 110483998 A | 11/2019 |

OTHER PUBLICATIONS

"Study on Preparation and Dielectric Property of Ag-Graphene/PVDF Composites", Jun. 2013, Li Lin, A Thesis Submitted for the Degree of Masters, Harbin Normal University, 67 pgs.
"Growth of HfO2 thin film by Remote Plasma Atomic Layer Deposition and the properties HfO2/Ge interface", 2016, 18 pgs.
"Application of rare earth in functional materials", Mar. 1991, He Lunyan, Jiangxi University, 9 pgs.
"Effects of La, Ce, Y and other rare earth elements on the structure and properties of Nb doped TO base pressure-5 sensitive ceramics", Mi Jia, Zhang Zhongtai and Tang Zilong, State Key Laboratory of Advanced Ceramics and Fine Technology, Department of Materials Science and Engineering, Tsinghua University, Beijing 100084, 5 pgs.

\* cited by examiner

DYNAMIC RANDOM ACCESS MEMORY CAPACITOR AND PREPARATION METHOD THEREFOR

CROSS-REFERENCE TO RELATED APPLICATIONS

The present application is a U.S. continuation application of International Application No. PCT/CN2021/105504, filed on Jul. 9, 2021, which claims priority to Chinese Patent Application No. 202011349123.8, filed on Nov. 26, 2020. International Application No. PCT/CN2021/105504 and Chinese Patent Application No. 202011349123.8 are incorporated herein by reference in their entireties.

TECHNICAL FIELD

The disclosure relates to the field of semiconductor elements, and in particular, to a Dynamic Random Access Memory (DRAM) capacitor and a preparation method therefor.

BACKGROUND

As the electronics industry develops towards multi-functionalization, the integration, miniaturization, and high performance of electronic devices have become a trend. For a DRAM capacitor, the dielectric material layer therein is getting thinner and thinner. Not only the technological manufacturing process is more and more difficult to achieve, but also the dielectric loss is getting higher and higher.

It is an urgent problem to be solved to provide a dielectric layer for the DRAM capacitor having a high dielectric constant and low dielectric loss.

SUMMARY

In one aspect, an embodiment of this disclosure provides a DRAM capacitor, including a dielectric layer. The dielectric layer includes a high dielectric material layer and low dielectric loss material layers provided on both side surfaces of the high dielectric material layer.

In another aspect, an embodiment of this disclosure provides a preparation method for a DRAM capacitor, including: S1, forming a low dielectric loss material layer; S2, forming a high dielectric material layer on the low dielectric loss material layer; and S3, forming a low dielectric loss material layer on the high dielectric material layer.

BRIEF DESCRIPTION OF THE DRAWINGS

The above-mentioned and other features and advantages of this disclosure will become more apparent by describing the exemplary implementations thereof in detail with reference to the accompanying drawings.

DESCRIPTION OF REFERENCE NUMERALS

Figure 1A:
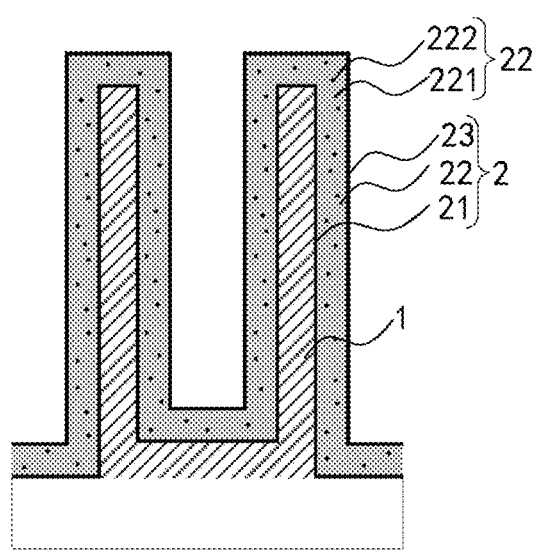
FIG. 1A is a schematic partial cross-section view of a DRAM capacitor according to an implementation of this disclosure.

1: First capacitor electrode
2: Dielectric layer
21, 21a, 21b: First low dielectric loss material layer
22: High dielectric material layer
221, 221a, 221b: Dielectric ceramic material particle
222, 222a, 222b: Doped particle
23: Second low dielectric loss material layer

DETAILED DESCRIPTION

The exemplary implementations will now be described more comprehensively with reference to the accompanying drawings. However, the exemplary implementations can be implemented in various forms, and should not be construed as being limited to the implementations set forth herein. Rather, these implementations are provided so that this disclosure will be comprehensive and complete, and will fully convey the concept of the exemplary implementations to those skilled in the art. In the drawings, the thicknesses of the regions and layers are exaggerated for purpose of clarity. The same reference numerals in the drawings represent the same or similar structures, and thus their detailed descriptions will be omitted.

The term "high dielectric constant material" herein refers to a material having a dielectric constant higher than 4. The term "low dielectric loss material" refers to a material having dielectric loss lower than 0.2.

The DRAM capacitor in this disclosure includes a dielectric layer. The dielectric layer includes a high dielectric material layer and low dielectric loss material layers provided on both side surfaces of the high dielectric material layer. The high dielectric material can increase the dielectric constant of the dielectric layer, such that it has better dielectric properties. The low dielectric loss material layers provided on both side surfaces can effectively alleviate the dielectric loss of the high dielectric material layer. As a result, a high dielectric constant and low dielectric loss of the dielectric layer can be achieved.

In an optional implementation, as shown in FIG. 1A, a dielectric layer 2 includes a high dielectric material layer 22, a first low dielectric loss material layer 21 provided on an inner side and on a surface of a first capacitor electrode 1 of the DRAM capacitor, and a second low dielectric loss material layer 23 provided on an outer side.

Figure 2A:
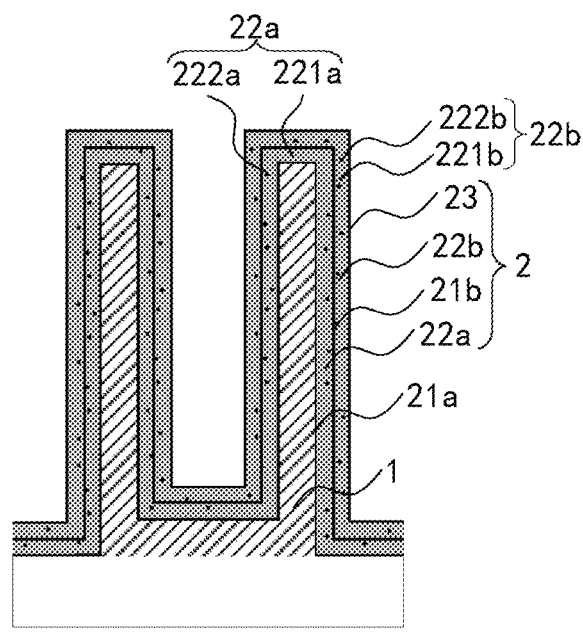
FIG. 2A is a schematic partial cross-section view of a DRAM capacitor according to another implementation of this disclosure.

In an optional implementation, as shown in FIG. 2A, the dielectric layer 2 includes two high dielectric material layers 22, namely, high dielectric material layers 22a and 22b. That is, the high dielectric material layers 22a, 22b and low dielectric loss material layers 21a, 21b, 23 are alternately arranged.

The above two modes are just examples. The dielectric layer can also be a stack of more layers, for example, a stack including three high dielectric material layers and four low dielectric loss material layers, or a stack including four high dielectric material layers and five low dielectric loss material layers, or the like.

Figure 1B:
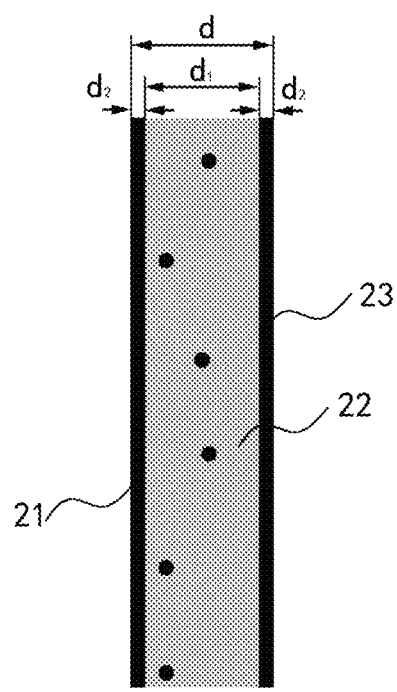
FIG. 1B is a partially enlarged schematic view of a dielectric layer of the DRAM capacitor in FIG. 1A.
Figure 2B:
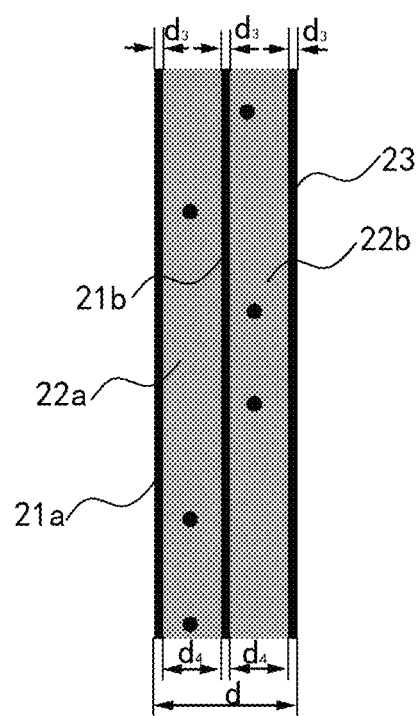
FIG. 2B is a partially enlarged schematic view of a dielectric layer of the DRAM capacitor in FIG. 2A.

In an optional implementation, a thickness ratio of the high dielectric material layer to the low dielectric loss material layers is 200-100:1. As shown in FIG. 1B, a total thickness d of the dielectric layer 2 is a sum of a thickness $d_1$ of the high dielectric material layer 22 and thicknesses $d_2$ of the low dielectric loss material layers 21 and 23 (i.e., $d=d_1+2d_2$). The ratio of the thickness $d_1$ of the high dielectric material layer 22 to the thicknesses $d_2$ of the low dielectric loss material layers 21, 23 is 200-100:1. When the dielectric layer 2 includes two high dielectric material layers, as shown in FIG. 2B, the total thickness d of the dielectric layer 2 is a sum of thicknesses $d_4$ of the high dielectric material layers 22a, 22b and thicknesses $d_3$ of the low dielectric loss material layers 21a, 21b, 23 (i.e., $d=2d_4+3d_3$). The ratio of the thicknesses $d_4$ of the high dielectric material layers 22a, 22b to the thicknesses $d_3$ of the low dielectric loss material layers 21a, 21b, 23 is 200-100:1. According to a formula related to capacitors in series, it can be known that the greater the ratio of the thickness of the high dielectric material layer to the thicknesses of the low dielectric loss material layers, the closer the dielectric constant of the dielectric layer is to the dielectric constant of the high dielectric material layer. Therefore, in order to exert the high dielectric constant performance of the high dielectric material layer, a larger thickness ratio tends to be selected. However, in consideration of the process feasibility and the overall thickness of the dielectric layer, in some embodiments, the thickness ratio of the high dielectric material layer to the low dielectric loss material layers is 200-100:1. Those skilled in the art may select any value in the above range according to specific needs, for example, 190:1, 180:1, 170:1, 160:1, 150:1, 140:1, 130:1, 120:1, 110:1, or the like. The thickness of the low dielectric loss material layer may be 0.34-10 nm. When the low dielectric loss material layer is a graphene oxide layer, single-layer graphene oxide may be used as the low dielectric loss material layer. The thickness of the single-layer graphene oxide layer is 0.34 nm. In comprehensive consideration of factors such as the performance, process feasibility, material type, and cost of the capacitor, an appropriate thickness of the low dielectric loss material layer is selected, for example but not limited to 1 nm, 2 nm, 3 nm, 4 nm, 5 nm, 6 nm, 7 nm, 8 nm, 9 nm, 10 nm, or the like.

In an optional implementation, the high dielectric material layer may be formed by, but is not limited to, a doped dielectric ceramic material. The doped dielectric ceramic material may be one or more dielectric ceramic materials selected from $HfO_2$, $TiO_2$, $ZrO_2$, or $CeO_2$ doped with one or more metals selected from Ag, In, Sb, Bi, Ta, La, Nd, or Ce. Based on the total weight of the doped dielectric ceramic material layer, when the doping amount is between 1.5% and 3.5%, the dielectric constant can reach the maximum. Therefore, those skilled in the art may select an appropriate value between 1.5% and 3.5% according to actual needs, for example, but not limited to, 1.8%, 2%, 2.3%, 2.5%, 2.8%, 3%, or the like.

The low dielectric loss material layer may be formed by a low dielectric loss insulating material, such as a polymer and graphene oxide. The polymer may be one or more selected from polyimide, polyvinylidene fluoride, epoxy resins, or polystyrene.

The inventive concept of this disclosure will be explained below with reference to the accompanying drawings by taking the high dielectric material layer being formed by the doped dielectric ceramic material as an example. However, those skilled in the art should understand that it is not intended to limit the high dielectric material only to be the doped dielectric ceramic material.

With reference to FIG. 1B, the dielectric ceramic material 221 forming the high dielectric material layer 22 comprises doped particles 222. Because a doped element replaces the metal in the dielectric ceramic material, more induced dipole moments are generated, and entry of doped ions into crystals will cause lattice distortion which facilitates polarization, thereby achieving a higher dielectric constant. However, the doped particles will cause electron displacement, resulting in higher dielectric loss. By wrapping the outer surface of the high dielectric material layer 22 with the first low dielectric loss material layer 21 and the second low dielectric loss material layer 23 provided on both sides of the high dielectric material layer 22, dielectric loss caused by ion doping can be effectively alleviated and the purpose of low loss is achieved. Moreover, the bonding strength between the dielectric ceramic material and the low dielectric loss material layers can be increased after the doping. The first low dielectric loss material layer 21 and the second low dielectric loss material layer 23 may be polymer layers or graphene oxide layers.

With reference to FIG. 2B, when the dielectric layer includes two high dielectric material layers, first low dielectric loss material layers 21a, 21b and a second low dielectric loss material layer 23 are stacked on both sides of the high dielectric material layer 22a and both sides of the high dielectric material layer 22b, respectively. The high dielectric material layers 22a and 22b include a dielectric ceramic material 221a, 221b and doped particles 222a, 222b, respectively. Based on the same principle as in the foregoing implementations, the high dielectric material layers 22a and 22b can have an increased dielectric constant of the material. The first low dielectric loss material layers 21a, 21b and the second low dielectric loss material layer 23 wrapping both sides of the dielectric ceramic material layer 22a and both sides of the dielectric ceramic material layer 22b achieve the purpose of low loss.

The DRAM capacitor in this disclosure can be prepared by the following method. At S1, a high dielectric material layer is formed. At S2, a low dielectric loss material layer is formed on the high dielectric material layer. At S3, a low dielectric loss material layer is formed on the high dielectric material layer. The steps S1, S2, and S3 only represent the sequence of the steps, and are not intended to limit a later step is performed immediately after a formed step. Other auxiliary steps may also be included between the steps, such as washing and drying. Multiple doped dielectric ceramic material layers can be prepared by repeating the steps S2 and S3 at least once. In some embodiments, the doped dielectric ceramic material layer is formed by atomic layer deposition in the step S2.

This disclosure is further described below through specific examples. However, these examples are merely exemplary and do not constitute any limitation to the scope of protection of this disclosure.

In the following examples and comparative examples, the reagents, materials, and instruments used are all commercially available unless otherwise specified.

Example 1

Single-layer graphene oxide (GO) was prepared by a Hummers method. That is, graphite powder/$NaNO_3$/$KMnO_4$ at a mass ratio of 10:5:12 mixed with a small amount of concentrated sulfuric acid/$H_2O_2$ was used as a reaction precursor, and the mixture underwent an oxidation-reduction reaction in an ice bath condition until the reaction was completed (a reaction temperature was controlled not to exceed 10° C.). Derivatives were removed by using $H_2SO_4$/$H_2O_2$/HCl to obtain graphene oxide. Single-layer graphene oxide was obtained by ultrasonic or mechanical exfoliation method. The single-layer graphene oxide was coated on the surface of the first capacitor electrode (TiN) by an in-situ spin coating method to form a graphene oxide layer.

A Sb-doped $HfO_2$ layer was obtained by deposition with tetrakis(diethylamino)hafnium (TDEAH), Sb(CH), and water as a reaction precursor and 99.99% high-purity nitrogen as a carrier and a purging gas, in which the temperature of the precursor was 100° C. and the temperature of the reaction chamber was 300° C.

A graphene oxide layer was further coated on the surface of the Sb-doped $HfO_2$ by spin-coating so that graphene oxide could wrap the Sb-doped $HfO_2$ layer.

A second capacitor electrode (TiN) was formed on the surface of the graphene oxide layer on the outer side, thereby completing the preparation of a DRAM capacitor.

The dielectric constant and dielectric loss of the capacitor were measured through AS2855 high-frequency dielectric constant and dielectric loss measuring system from Shanghai AE Electronics Co., Ltd. The AS2855 high-frequency dielectric constant and dielectric loss measuring system consists of an S916 test device (clamp), a QBG-3E/QBG-3F/AS2853A high-frequency Q meter, a data acquisition and tan δ automatic measurement control (a software module installed into QBG-3E/QBG-3F/AS2853A), and an LKI-1 type inductor. The QBG-3E/3F or AS2853A digital Q meter is used to automatically calculate the dielectric constant (ε) and dielectric loss (tan δ). The measuring results of the capacitor and the compositions and thicknesses of the layers in the dielectric layer are shown in Table 1.

Example 2

An Ag-doped $TiO_2$ layer was obtained by deposition with cyclotetrakis(dimethylamino)titanium, $CH_3COOAg$, and water as a reaction precursor and 99.99% high-purity Ar as a carrier and a purging gas, in which the temperature of the precursor was 100° C. and the temperature of the reaction chamber was 300° C.

The formation of other layers and the measuring method are the same as in Example 1.

The measuring results of the capacitor prepared in this Example and the compositions and thicknesses of the layers in the dielectric layer are shown in Table 1.

Example 3

An In- and Sb-doped $TiO_2$ layer was obtained by deposition with cyclotetrakis(dimethylamino)titanium, InSb, and water as a reaction precursor and 99.99% high-purity Ar as a carrier and a purging gas, in which the temperature of the precursor was 100° C. and the temperature of the reaction chamber was 300° C.

A polyimide precursor solution having a concentration of 25% was prepared by using a certain mass of polyimide solid particles and an all-purpose solvent N,N-dimethylformamide. Then, the precursor solution was spin-coated on TiN by a high-speed spin coating method at a rotating speed of 5000. Then, the same was put into a tube furnace and annealed at 200° C. to obtain a polyimide film layer having a thickness of 2 nm.

The formation of other layers and the measuring method are the same as in Example 1.

The measuring results of the capacitor prepared in this Example and the compositions and thicknesses of the layers in the dielectric layer are shown in Table 1.

Example 4

A Bi-doped $ZrO_2$ layer was obtained by deposition with tetrakis(dimethylamino)zirconium, $C_6H_9BiO_6$, and water as a reaction precursor and 99.99% high-purity Ar as a carrier and a purging gas, in which the temperature of the precursor was 100° C. and the temperature of the reaction chamber was 300° C.

The formation of other layers and the measuring method are the same as in Example 3.

The measuring results of the capacitor prepared in this Example and the compositions and thicknesses of the layers in the dielectric layer are shown in Table 1.

Example 5

A Ta-doped $TiO_2$ layer was obtained by deposition with tetrakis(dimethylamino)zirconium, TaH, and water as a reaction precursor and 99.99% high-purity Ar as a carrier and a purging gas, in which the temperature of the precursor was 100° C. and the temperature of the reaction chamber was 300° C.

A precursor solution having a concentration of 25% was prepared by using polyvinylidene fluoride, N,N-dimethylformamide, and acetone. Heating was performed for dissolution. By an electrostatic spinning method and at a high voltage of 10 KV, the precursor solution was deposited on a TIN electrode by forming a Tyler cone and being in a form of drawn wires. Annealing was perform at 200° C. to obtain a polyvinylidene fluoride fiber film layer having a thickness of 2 nm.

The formation of other layers and the measuring method are the same as in Example 1.

The measuring results of the capacitor prepared in this Example and the compositions and thicknesses of the layers in the dielectric layer are shown in Table 1.

Example 6

A La-doped $HfO_2$ layer was obtained by deposition with tetrakis(diethylamino)hafnium (TDEAH), LaH, and water as a reaction precursor and 99.99% high-purity nitrogen as a carrier and a purging gas, in which the temperature of the precursor was 100° C. and the temperature of the reaction chamber was 300° C.

The formation of other layers and the measuring method are the same as in Example 5.

The measuring results of the capacitor prepared in this Example and the compositions and thicknesses of the layers in the dielectric layer are shown in Table 1.

Example 7

A Ce-doped $HfO_2$ layer was obtained by deposition with tetrakis(diethylamino)hafnium (TDEAH), $Ce(AC)_3$, and water as a reaction precursor and 99.99% high-purity nitrogen as a carrier and a purging gas, in which the temperature of the precursor was 100° C. and the temperature of the reaction chamber was 300° C.

The formation of other layers and the measuring method are the same as in Example 1.

The measuring results of the capacitor prepared in this Example and the compositions and thicknesses of the layers in the dielectric layer are shown in Table 1.

Example 8

A three-layer structure was prepared by the same method as in Example 1. Then, the formations of the Sb-doped $HfO_2$ layer and the GO layer were respectively repeated once. Lastly, a second capacitor electrode was formed, so as to complete the preparation of a DRAM capacitor. The dielectric constant and dielectric loss of the capacitor were measured by the same method as in Example 1.

The measuring results of the capacitor prepared in this Example and the compositions and thicknesses of the layers in the dielectric layer are shown in Table 1.

Comparative Example 1

An HfO$_2$ layer was obtained by deposition with tetrakis(diethylamino)hafnium (TDEAH) and water as a reaction precursor and 99.99% high-purity nitrogen as a carrier and a purging gas, in which the temperature of the precursor is 100° C. and the temperature of the reaction chamber is 300° C. The formation of other layers and the measuring method are the same as in Example 1.

The measuring results of the capacitor prepared in this Comparative Example and the compositions and thicknesses of the dielectric layer are shown in Table 1.

Comparative Example 2

A Sb-doped HfO$_2$ layer was obtained by deposition with tetrakis(diethylamino)hafnium (TDEAH), SbCl$_3$/Sb(CH), and water as a reaction precursor and 99.99% high-purity nitrogen as a carrier and a purging gas, in which the temperature of the precursor was 100° C. and the temperature of the reaction chamber was 300° C.

The measuring results of the capacitor prepared in this Comparative Example and the compositions and thicknesses of the dielectric layer are shown in Table 1.

TABLE 1

| Example | Doped dielectric ceramic material layer | | | | Polymer layer/graphene oxide layer | | | Di-electric constant | Di-electric loss |
|---|---|---|---|---|---|---|---|---|---|
| | Number of layers | Material | Doping amount (wt %) | Thickness (nm) | Number of layers | Material | Thickness (nm) | | |
| Example 1 | 1 | Sb-doped HfO$_2$ | 2.5 | 100 | 2 | graphene oxide | 1 | 40.8 | 0.006 |
| Example 2 | 1 | Ag-doped TiO$_2$ | 2.5 | 100 | 2 | graphene oxide | 1 | 52.2 | 0.006 |
| Example 3 | 1 | In- and Sb-doped TiO$_2$ | 2.5 | 200 | 2 | Polyimide | 2 | 41.8 | 0.007 |
| Example 4 | 1 | Bi-doped ZrO$_2$ | 2.5 | 200 | 2 | Polyimide | 2 | 40.8 | 0.004 |
| Example 5 | 1 | Ta-doped ZrO$_2$ | 2.5 | 200 | 2 | Polyvinylidene fluoride | 2 | 32.2 | 0.007 |
| Example 6 | 1 | La-doped HfO$_2$ | 2.5 | 200 | 2 | Polyvinylidene fluoride | 2 | 42 | 0.005 |
| Example 7 | 1 | Ce-doped HfO$_2$ | 2.5 | 100 | 2 | graphene oxide | 1 | 33.3 | 0.006 |
| Example 8 | 2 | Sb-doped HfO$_2$ | 2.5 | 100 | 3 | graphene oxide | 1 | 37.5 | 0.004 |
| Comparative Example 1 | 1 | HfO$_2$ | 0 | 100 | — | — | — | 25 | 0.2 |
| Comparative Example 2 | 1 | Sb-doped HfO$_2$ | 2.5 | 100 | — | — | — | 50 | 0.4 |

As shown in Table 1, it can be seen from the data of Examples 1-8 and Comparative Examples 1 and 2 that the dielectric layer in this disclosure can indeed achieve both a high dielectric constant and low dielectric loss of the capacitor.

The embodiments of this disclosure disclosed above are only used to explain this disclosure. In some embodiments, not all of the details have been described in detail. It is not intended to limit this disclosure to only the specific implementations described herein. Apparently, many modifications and changes can be made according to the contents of the description. These embodiments are selected and specifically described in the description in order to better explain the principles and practical applications of this disclosure, so that those skilled in the art can understand and use this disclosure well. This disclosure is limited only by the claims and the full scope and equivalents thereof.

The invention claimed is:

1. A dynamic random access memory capacitor, comprising a dielectric layer, wherein the dielectric layer comprises:
    a high dielectric material layer; and
    low dielectric loss material layers, provided on both side surfaces of the high dielectric material layer,
    wherein a thickness ratio of the high dielectric material layer to the low dielectric loss material layers is (200-100):1, and a thickness of each of the low dielectric loss material layers is 0.34-10 nm.

2. The dynamic random access memory capacitor of claim 1, wherein the dielectric layer comprises one or more high dielectric material layers.

3. The dynamic random access memory capacitor of claim 2, wherein the dielectric layer comprises two high dielectric material layers.

4. The dynamic random access memory capacitor of claim 1, wherein the thickness ratio of the high dielectric material layer to the low dielectric loss material layers is (200-150):1.

5. The dynamic random access memory capacitor of claim 1, wherein the thickness of each of the low dielectric loss material layers is 1-5 nm.

6. The dynamic random access memory capacitor of claim 1, wherein the high dielectric material layer comprises a doped dielectric ceramic material, and the doped dielectric ceramic material is one or more dielectric ceramic materials selected from HfO$_2$, TiO$_2$, ZrO$_2$, or CeO$_2$ doped with one or more metals selected from Ag, In, Sb, Bi, Ta, La, Nd, or Ce.

7. The dynamic random access memory capacitor of claim 6, wherein based on a total weight of the doped dielectric ceramic material, a doping amount of the one or more metals selected from Ag, In, Sb, Bi, Ta, La, Nd, or Ce is 1.5%-3.5% by weight.

8. The dynamic random access memory capacitor of claim 1, wherein each of the low dielectric loss material layers comprises one or more of polyimide, polyvinylidene fluoride, epoxy resins, polystyrene, and graphene oxide.

9. A preparation method for a dynamic random access memory capacitor, comprising:
S1, forming a first low dielectric loss material layer;
S2, forming a high dielectric material layer on the first low dielectric loss material layer; and
S3, forming a second low dielectric loss material layer on the high dielectric material layer
wherein a thickness ratio of the high dielectric material layer to a sum of a thickness of the first low dielectric loss material layer and a thickness of the second low dielectric loss material layer is (200-100):1, the thickness of the first low dielectric loss material layer is 0.34-10 nm, and the thickness of the second low dielectric loss material layer is 0.34-10 nm.

10. The preparation method of claim 9, wherein the steps S2 and S3 are repeated at least once in sequence.

11. The preparation method of claim 9, wherein the high dielectric material layer comprises a doped dielectric ceramic material, and the high dielectric material layer is formed by atomic layer deposition of the doped dielectric ceramic material.

12. The preparation method of claim 11, wherein the doped dielectric ceramic material is one or more dielectric ceramic materials selected from $HfO_2$, $TiO_2$, $ZrO_2$, or $CeO_2$ doped with one or more metals selected from Ag, In, Sb, Bi, Ta, La, Ce, or Nd.

13. A dynamic random access memory capacitor, comprising a dielectric layer, wherein the dielectric layer comprises:
a high dielectric material layer; and
low dielectric loss material layers, provided on both side surfaces of the high dielectric material layer,
wherein the dielectric layer comprises two high dielectric material layers.

14. The dynamic random access memory capacitor of claim 13, wherein a thickness ratio of the high dielectric material layer to the low dielectric loss material layers is (200-100):1, and a thickness of each of the low dielectric loss material layers is 0.34-10 nm.

15. The dynamic random access memory capacitor of claim 14, wherein the thickness ratio of the high dielectric material layer to the low dielectric loss material layers is (200-150):1.

16. The dynamic random access memory capacitor of claim 14, wherein the thickness of each of the low dielectric loss material layers is 1-5 nm.

17. The dynamic random access memory capacitor of claim 13, wherein the high dielectric material layer comprises a doped dielectric ceramic material, and the doped dielectric ceramic material is one or more dielectric ceramic materials selected from $HfO_2$, $TiO_2$, $ZrO_2$, or $CeO_2$ doped with one or more metals selected from Ag, In, Sb, Bi, Ta, La, Nd, or Ce.

18. The dynamic random access memory capacitor of claim 17, wherein based on a total weight of the doped dielectric ceramic material, a doping amount of the one or more metals selected from Ag, In, Sb, Bi, Ta, La, Nd, or Ce is 1.5%-3.5% by weight.

19. The dynamic random access memory capacitor of claim 13, wherein each of the low dielectric loss material layers comprises one or more of polyimide, polyvinylidene fluoride, epoxy resins, polystyrene, and graphene oxide.

* * * * *